(12) United States Patent
Forbes

(10) Patent No.: US 6,878,991 B1
(45) Date of Patent: Apr. 12, 2005

(54) VERTICAL DEVICE 4F2 EEPROM MEMORY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/769,116

(22) Filed: Jan. 30, 2004

(51) Int. Cl.[7] .................... H01L 29/76; H01L 29/94; H01L 31/062

(52) U.S. Cl. ................. 257/328; 257/329; 257/316

(58) Field of Search ........................ 257/328, 329, 257/316

(56) References Cited

U.S. PATENT DOCUMENTS

| | | | |
|---|---|---|---|
| 4,184,207 A | 1/1980 | McElroy | |
| 4,420,504 A | 12/1983 | Cooper | |
| 4,755,864 A | 7/1988 | Ariizumi | |
| 4,881,114 A | 11/1989 | Mohsen | |
| 5,241,496 A | 8/1993 | Lowrey | |
| 5,330,930 A | 7/1994 | Chi | |
| 5,378,647 A | 1/1995 | Hong | |
| 5,379,253 A | 1/1995 | Bergemont | |
| 5,397,725 A | 3/1995 | Wolstenholme | |
| 5,467,305 A | 11/1995 | Bertin | |
| 5,576,236 A | 11/1996 | Chang | |
| 5,768,192 A | 6/1998 | Eitan | |
| 5,792,697 A | 8/1998 | Wen | |
| 5,858,841 A | 1/1999 | Hsu | |
| 5,911,106 A | 6/1999 | Tasaka | |
| 5,936,274 A | 8/1999 | Forbes | |
| 5,946,558 A | 8/1999 | Hsu | |
| 5,966,603 A | 10/1999 | Eitan | |
| 5,991,225 A | 11/1999 | Forbes | |
| 5,994,745 A | 11/1999 | Hong | |
| 6,011,725 A | 1/2000 | Eitan | |
| 6,028,342 A | 2/2000 | Chang | |
| 6,030,871 A | 2/2000 | Eitan | |
| 6,044,022 A | 3/2000 | Nachumovsky | |
| 6,072,209 A | 6/2000 | Noble | |
| 6,081,456 A | 6/2000 | Dadashev | |
| 6,108,240 A | 8/2000 | Lavi | |
| 6,133,102 A | 10/2000 | Wu | |
| 6,134,156 A | 10/2000 | Eitan | |
| 6,134,175 A | 10/2000 | Forbes | |
| 6,147,904 A | 11/2000 | Liron | |

(Continued)

FOREIGN PATENT DOCUMENTS

| | | |
|---|---|---|
| EP | 84303740.9 | 1/1985 |
| EP | 90115805.5 | 2/1991 |
| EP | 01113179.4 | 12/2002 |

OTHER PUBLICATIONS

U.S. Appl. No. 10/738,783, filed Dec. 17, 2003, Forbes.
U.S. Appl. No. 10/738,556, filed Dec. 17, 2003, Forbes.
U.S. Appl. No. 10/785,310, filed Feb. 24, 2004, Forbes.

(Continued)

Primary Examiner—David Nelms
Assistant Examiner—Tu-Tu Ho
(74) Attorney, Agent, or Firm—Leffert Jay & Polglaze, P.A.

(57) ABSTRACT

EEPROM memory devices and arrays are described that facilitate the use of vertical floating gate memory cells and select gates in NOR or NAND high density memory architectures. Memory embodiments of the present invention utilize vertical select gates and floating gate memory cells to form NOR and NAND architecture memory cell strings, segments, and arrays. These memory cell architectures allow for improved high density memory devices or arrays with integral select gates that can take advantage of the features semiconductor fabrication processes are generally capable of and allow for appropriate device sizing for operational considerations. The memory cell architectures also allow for mitigation of disturb and overerasure issues by placing the floating gate memory cells behind select gates that isolate the memory cells from their associated bit lines and/or source lines.

38 Claims, 11 Drawing Sheets

U.S. PATENT DOCUMENTS

| | | | |
|---|---|---|---|
| 6,150,687 A | 11/2000 | Noble | |
| 6,153,468 A | 11/2000 | Forbes | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,219,299 B1 | 4/2001 | Forbes | |
| 6,222,768 B1 | 4/2001 | Hollmer | |
| 6,240,020 B1 | 5/2001 | Yang | |
| 6,243,300 B1 | 6/2001 | Sunkavalli | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,348,711 B1 | 2/2002 | Eitan | |
| 6,392,930 B1 | 5/2002 | Jung | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,448,601 B1 | 9/2002 | Forbes | |
| 6,461,949 B1 | 10/2002 | Chang | |
| 6,468,864 B1 | 10/2002 | Sung | |
| 6,469,342 B1 | 10/2002 | Kuo | |
| 6,476,434 B1 | 11/2002 | Noble | |
| 6,477,084 B1 | 11/2002 | Eitan | |
| 6,486,028 B1 | 11/2002 | Chang | |
| 6,487,050 B1 | 11/2002 | Liu | |
| 6,498,377 B1 | 12/2002 | Lin | |
| 6,514,831 B1 | 2/2003 | Liu | |
| 6,531,887 B1 | 3/2003 | Sun | |
| 6,545,309 B1 | 4/2003 | Kuo | |
| 6,552,387 B1 | 4/2003 | Eitan | |
| 6,559,013 B1 | 5/2003 | Pan | |
| 6,566,682 B1 | 5/2003 | Forbes | |
| 6,576,511 B1 | 6/2003 | Pan | |
| 6,580,135 B1 | 6/2003 | Chen | |
| 6,580,630 B1 | 6/2003 | Liu | |
| 6,602,805 B1 | 8/2003 | Chang | |
| 6,607,957 B1 | 8/2003 | Fan | |
| 6,610,586 B1 | 8/2003 | Liu | |
| 6,613,632 B1 | 9/2003 | Liu et al. | |
| 6,617,204 B1 | 9/2003 | Sung | |
| 6,720,216 B1 | 4/2004 | Forbes | |
| 6,744,094 B1 | 6/2004 | Forbes | |
| 6,762,955 B1 * | 7/2004 | Sakui et al. | 365/185.05 |
| 6,768,162 B1 * | 7/2004 | Chang et al. | 257/316 |
| 2001/0001075 A1 | 5/2001 | Ngo | |
| 2001/0004332 A1 | 6/2001 | Eitan | |
| 2001/0011755 A1 | 8/2001 | Tasaka | |
| 2002/0142569 A1 | 10/2002 | Chang | |
| 2002/0146885 A1 | 10/2002 | Chen | |
| 2002/0151138 A1 | 10/2002 | Liu | |
| 2002/0177275 A1 | 11/2002 | Liu | |
| 2002/0182829 A1 | 12/2002 | Chen | |
| 2003/0057997 A1 | 3/2003 | Sun | |
| 2003/0067807 A1 | 4/2003 | Lin | |
| 2003/0117861 A1 | 6/2003 | Maayan | |
| 2003/0235075 A1 | 12/2003 | Forbes | |
| 2003/0235076 A1 | 12/2003 | Forbes | |
| 2003/0235079 A1 | 12/2003 | Forbes | |

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556–558, Copyright 2001 IEEE.

B. Eitan et al., "Spatial Characterization of Hot Carriers Injected into the Gate Dielectric Stack of a MOSFET Based on Non–Volatile Memory Device," date unknown, pp. 58–60.

B. Eitan et al., "NROM: A Novel Localized Trapping, 2–Bit Nonvolatile Memory Cell," IEEE Electron Device Lett, vol. 21, No. 11, (Nov. 2000), pp. 543–545, Copyright 2000 IEEE.

E. Maayan et al., "A 512Mb NROM Flash Data Storage Memory with 8MB/s Data Range," Dig. IEEE Int. Solid–State Circuits Conf., San Francisco, (Feb. 2002), pp. 1–8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non–Volatile Memories, 6.1 and 6.2, pp. 76–77, 407–408. Copyright 1990 IEEE.

M. Janai, "Data Retention, Endurance and Acceleration Factors of NROM Devices," IEEE $41^{st}$ Annual International Reliability Physics Symposium, Dallas, TX (2003), pp. 502–505, Copyright 1989 IEEE.

S. Minami and Y. Kamigaki, "A Novel MONOS Nonvolatile Memory Device Ensuring 10–Year Data Retention after $10^7$ Erase/Write Cycles," IEEE Transactions on Electron Devices, vol. 40, No. 11 (Nov. 1993) pp. 2011–2017, Copyright 1998 IEEE.

C. Pan, K. Wu, P. Freiberger, A. Chatterjee, G. Sery, "A Scaling Methodology for Oxide–Nitride–Oxide Interpoly Dielectric for EPROM Applications," IEEE Transactions on Electron Devices, vol. 37, No. 6, (Jun. 1990), pp. 1439–1443, Copyright 1990 IEEE.

P. Manos and C. Hart, "A Self–Aligned EPROM Structure with Superior Data Retention," IEEE Electron Device Letters, vol. 11, No. 7, (Jul. 1990) pp. 309–311, Copyright 1990 IEEE.

W. Owen and W. Tchon, "$E^2$PROM Product Issues and Technology Trends," IEEE 1989, pp. 17–19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256–258, Copyright 1998 IEEE.

B. Eitan et al., "Electrons Retention Model for Localized Charge in Oxide—Nitride–Oxide (ONO) Dielectric," IEEE Device Lett., vol. 23, No. 9, (Sep. 2002), pp. 556–558. Copyright 2002 IEEE.

T. Nozaki, T. Tanaka, Y. Kijiya, E. Kinoshita, T. Tsuchiya, Y. Hayashi, "A 1–Mb EEPROM with MONOS Memory Cell for Semiconductor Disk Application," IEEE Journal of Solid–State Circuits, vol. 26, No. 4 (Apr. 1991), pp. 497–501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1–25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939–1946, Copyright 2002 IEEE.

B. Eitan et al., "Spatial characterization of Channel hot electron injection utilizing subthreshold slope of the localized charge storage NROM™ memory device," Non–Volatile Semiconductor Memory Workshop (NVSMW), Monterey, CA, (Aug. 2001), pp. 1–2.

B. Eitan et al., "Can NROM, a 2–bit, Trapping Storage NVM Cell, Give a Real Challenge to Floating Gate Cells?" Int. Conf. on Solid State Devices and Materials, Tokyo, (1999), pp. 1–3, Copyright 1999 Saifun Semiconductors Ltd.

S. Ogura, et al., "Twin MONOS Cell with Dual Control Gates," Halo LSI and New Halo, pp 187–187.3, Date Unknown.

T. Sugizaki, et al. "New 2–bit/Tr MONOS Type Flash Memory using Al$_2$O$_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit MicroFlash® Memory Cells," Characterization and Metrology for ULSI Technology: 200 International Conf., pp. 181–185, Copyright 2001 American Institute of Physics, 1–56396–967–X/01.

W.J. Tsai, et al. "Cause of Data Retention Loss in a Nitride–Based Localized Trapping Storage Flash Memory Cell," IEEE 40$^{th}$ Annual International Reliability Physics Symposium, Dallas, (2002), pp. 34–38. Copyright 2002 IEEE.

W.J. Tsai, et al. "Data Retention Behavior of a SONOS Type Two–Bit Storage Flash Memory Cell," IEDM 01–0179–01–722, Copyright 2001 IEEE.

A. Shappir, et al. "Subtreshold slope degradation model for localized–charge–trapping based non–volatile memory devices," Solid–State Electronics 47 (2003), pp. 937–941, Copyright 2003 Elsevier Science Ltd.

R. Neale, "AMD's MirrorBit—a big step in Flash progress," Electronic Engineering Design, V. 74, No. 906, pp. 47–50.

I. Bloom, et al., "NROM™—a New technology for non–volatile memory products" Solid–State Electronics 46 (2002), pp. 1757–1763. Copyright 2002 Elsevier Science Ltd.

J. Bu and M. White, "Electrical characterization on ONO triple dielectric in SONOS nonvolatile memory devices," Solid–State Electronics 45 (2001) pp. 47–51. Copyright 2001 Elsevier Science Ltd.

Y. Kamigaki and S. Minami, "MNOS Nonvolatile Semiconductor Memory Technology: Present and Future," IEICE Trans. Electron, vol. E84–C, No. 6, pp. 713–723 (Jun. 2001).

E. Lusky, et al., "Electron Discharge Model of Locally–Trapped Charge in Oxide–Nitride–Oxide (ONO) Gates for NROM™ Non–Volatile Semiconductor Memory Devices," Extended Abstracts of the 2001 International Conference on Solid State Devices and Materials, Tokyo, 2001 pp. 534–535.

A. Nughin, "n–Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228–229, 319.

G. Xue, et al., "Low Voltage Low Cost Nitride Embedded Flash Memory Cell" IMEC., Date Unknown.

L. Breuil, et al., "A new 2 isolated–bits/cell flash memory device with self aligned split gate structure using ONO stacks for charge storage," IMEC, Date Unknown.

J. Willer, et al., "UMEM: A U–shape Non–Volatile–Memory Cell," Ingentix GmbH &Co. KG, Infineon Technologies and Saifun Semiconductors, Date Unknown.

S. Kang, et al., "A Study of SONOS Nonvolatile Memory Cell Controlled Structurally by Localizing Charge–Trapping Layer," Samsung Electrons Co., Ltd., Date Unknown.

Y. Roizin, et al., "In–Process Charging in microFLASH® Memory Cells," Tower Semiconductor, Ltd., Date Unknown.

A. Shappir, et al., "Subthreshold slope degradation model for localized–charge–trapping based non–volatile memory devices," Solid State Electronics, 47 (2003) pp. 937–941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1–2, Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao–Tung University, Date Unknown.

Y. K. Lee, et al., "30–nm Twin Silicon–Oxide–Nitride–Oxide–Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non–Volatile Memory for the Embedded SoC Solution," 2003 Symposium on VLSI Technology Digest of Technical Papers, pp. 31–32.

Y. Hayashi, et al., "Twin MONOS Cell with Dual Control Gates," 2000 Symposium on VLSI Technology Digest of Technical Papers, 2000 IEEE, pp. 122–123.

M. K. Cho and D. M. Kim, "High Performance SONOS Memory Cells Free of Drain Turn–On and Over–Erase: Compatibility Issue with Current Flash Technology," IEEE Electron Device Letters, vol. 21, No. 8, Aug. 2000, pp. 399–401, Copyright 2000 IEEE.

T. Y. Chan, K.K. Young and C. Hu, "A True Single–Transistor Oxide–Nitride–Oxide EEPROM Device," IEEE Electron Device Letters, vol. EDL–8, No. 3, Mar. 1987, pp. 93–95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002, IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147–148.

* cited by examiner

VERTICAL DEVICE 4F2 EEPROM MEMORY

RELATED APPLICATION

This application is related to U.S. application Ser. No. 10/785,310 filed Feb. 24, 2004, entitled "$4F^2$ EEPROM NROM MEMORY ARRAYS WITH VERTICAL DEVICES," which is commonly assigned.

TECHNICAL FIELD OF THE INVENTION

The present invention relates generally to integrated circuits and in particular the present invention relates to EEPROM memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates (floating gates). Data is stored in the memory cells in the form of charge on the floating gates. Each of the cells within an EEPROM memory array can be electrically programmed in a random basis by charging the floating gate. The charge can also be randomly removed from the floating gate by an erase operation. Charge is transported to or removed from the individual floating gates by specialized programming and erase operations, respectively.

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

A problem in floating gate memory cell arrays is the issue of overerased memory cells. A floating gate memory cell is structurally similar to a MOSFET transistor, with a control gate separated from a channel, source, and drain by an insulator. In addition, embedded in the insulator is an isolated floating gate. As in a MOSFET transistor, current flows when the floating gate memory cell/transistor is selected or activated, charge trapped on the floating gate affects the amount of current flow in the floating gate transistor, effectively raising or lowering its threshold. In programming or erasing a floating gate memory cell, charge is transported to or from the electrically insulated floating gate of the floating gate transistor. If too much charge is removed from the floating gate of the floating gate transistor/memory cell it will flow current even when it is not selected. Floating gate transistors in this overerased state can affect current flow on shared bitlines and/or memory strings and thus potentially corrupt data read from other memory cells these common bitlines and/or memory strings.

In addition, as integrated circuit processing techniques improve, manufacturers try to reduce the feature sizes of the devices produced and thus increase the density of the IC circuits and memory arrays. In floating gate memory arrays in particular, the channel length of the floating gate memory cells that make up the memory array and spacing between memory cells in the strings have a large effect on the number of memory cells that can be placed in a given area and thus a direct impact on the density of the array and size of the resulting memory device.

For the reasons stated above, and for other reasons stated below which will become apparent to those skilled in the art upon reading and understanding the present specification, there is a need in the art for a method and architecture for producing a more closely spaced and, thus, higher density floating gate memory array with improved overerasure handling properties.

SUMMARY OF THE INVENTION

The above-mentioned problems with producing a more closely spaced and higher density floating gate memory array with improved overerasure handling properties and other problems are addressed by the present invention and will be understood by reading and studying the following specification.

EEPROM memory devices and arrays, in accordance with embodiments of the present invention, facilitate the utilization of vertical floating gate memory cells and select gates in NOR or NAND high density memory architectures. Memory embodiments of the present invention utilize vertical select gates and floating gate memory cells to form NOR and NAND architecture memory cell strings, segments, and arrays. These memory cell architectures allow for improved high density memory devices or arrays with integral select gates that can take advantage of the feature sizes semiconductor fabrication processes are generally capable of and allow for appropriate device sizing for operational considerations. The memory cell architectures also allow for mitigation of disturb and overerasure issues by placing the floating gate memory cells behind select gates that isolate the memory cells from their associated bit lines and/or source lines.

For one embodiment, the invention provides a memory device comprising a NOR architecture floating gate memory array formed on a substrate having a plurality of pillars and associated intervening trenches, and a plurality of memory cell structures. Each memory cell structure having a floating gate memory cell, wherein the floating gate memory cell is formed vertically on a first sidewall of a trench, and a select gate, wherein the select gate is formed on a second sidewall of the trench and wherein the select gate is coupled to the floating gate memory cell by a source and drain region formed at the bottom of the trench.

For another embodiment, the invention provides a floating gate memory cell structure comprising a substrate, having two raised areas, defining a trench therebetween. A floating gate memory cell is formed vertically on a first sidewall of the trench, and a select gate memory cell is formed vertically on a second sidewall of the trench. Where the floating gate memory cell is coupled to the select gate by source and drain region formed at the bottom of the trench.

For yet another embodiment, the invention provides a method of forming a floating gate memory cell structure comprising forming two raised areas on a substrate, the raised areas defining an associated intervening trench. Forming a floating gate memory cell on a first sidewall of the trench and a select gate on a second sidewall of the trench, and forming a source and drain region at the bottom of the associated intervening trench.

For a further embodiment, the invention provides a NAND architecture floating gate memory cell string comprising a substrate, having two or more raised areas, defining trenches therebetween. A plurality of floating gate memory cells are formed vertically on the sidewalls of the trenches, wherein the plurality of floating gate memory cells are coupled in a serial string by source/drain regions formed at the top of the two or more raised areas and at the bottom of the one or more trenches. A first floating gate memory cell is coupled to a first select gate, where the first select gate is formed vertically on a sidewall of a selected trench.

For yet a further embodiment, the invention provides a memory device comprising a NAND architecture memory array formed on a substrate having a plurality of pillars and associated intervening trenches. The memory array having a plurality of floating gate memory cells formed vertically on the sidewalls of the plurality of pillars and trenches, wherein the plurality of floating gate memory cells are coupled into a plurality of NAND architecture memory strings by source/drain regions formed at the top of the plurality of pillars and at the bottom of the associated trenches. A first floating gate memory cell of each string of the array is coupled to a first vertical select gate and a last floating gate memory cell of each NAND architecture memory string is coupled to a second vertical select gate. The memory device also comprises a control circuit, a row decoder, a plurality of word lines coupled to the row decoder, a plurality of select lines, at least one bitline, and at least one source line. Wherein each word line is coupled to one or more control gates of one or more floating gate memory cells, where each of the one or more floating gate memory cells is from a differing string of the plurality of NAND architecture memory strings. Each select line is coupled to one or more select gates. The at least one bitline is coupled to a drain of the first select gate of each string of the plurality of NAND architecture memory strings. And the at least one source line is coupled to a source of the second select gate of each string of the plurality of NAND architecture memory strings.

For another embodiment, the invention provides a method of forming a NAND architecture memory cell string comprising forming one or more raised areas on a substrate, the raised areas defining associated intervening trenches, forming a plurality of floating gate memory cells on the sidewalls of the one or more raised areas, forming one or more source/drain regions on the top of the one or more raised areas and at the bottom of the one or more associated intervening trenches, and forming a first vertical select gate coupled to a first floating gate memory cell of the NAND architecture memory string and a second vertical select gate coupled to a last floating gale memory cell of the NAND architecture memory string.

Other embodiments are also described and claimed.

DETAILED DESCRIPTION OF THE INVENTION

Figure 1A:
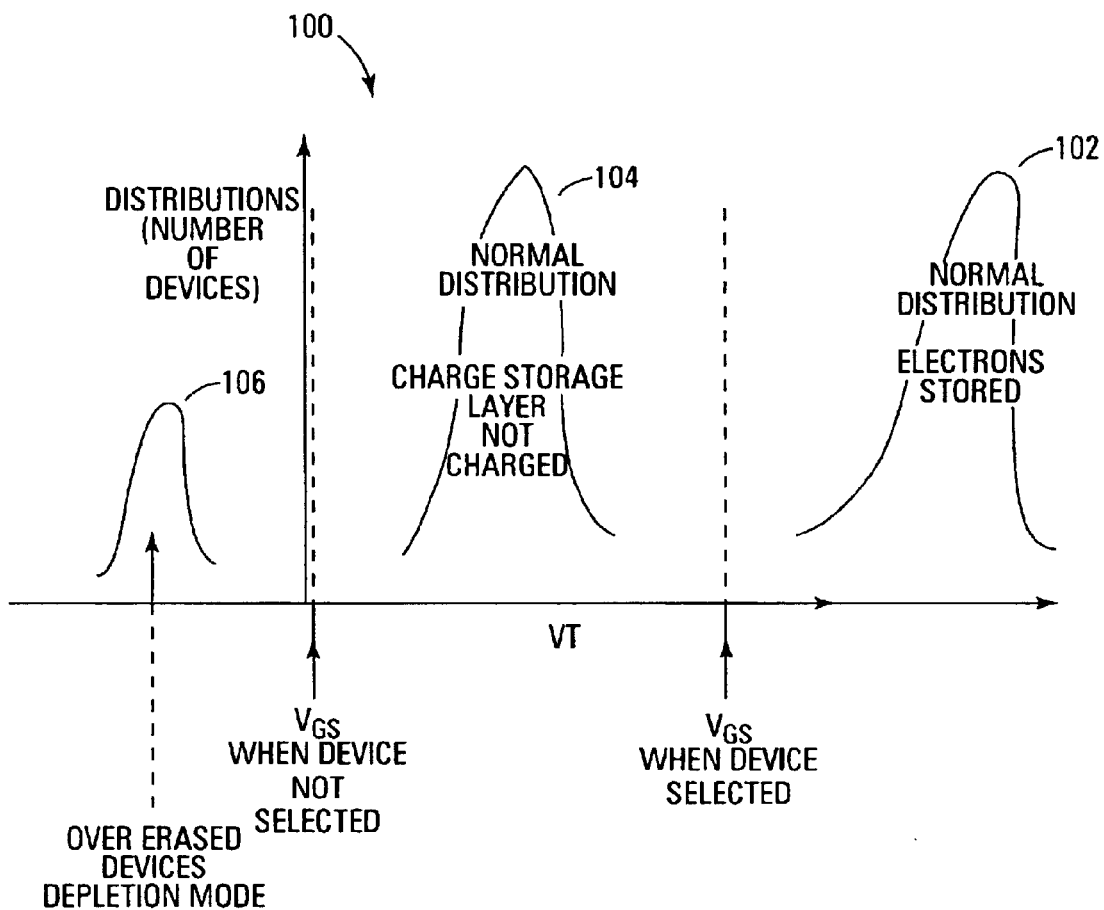
FIGS. 1A and 1B detail erase operations in floating gate memory cells.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

EEPROM memory devices and arrays, in accordance with embodiments of the present invention, facilitate the utilization of vertical floating gate memory cells and select gates in NOR or NAND high density memory architectures. Memory embodiments of the present invention utilize vertical select gates and floating gate memory cells to form NOR and NAND architecture memory cell segments and arrays. These memory cell architectures allow for improved high density memory devices or arrays with integral select gates that can take advantage of the feature sizes semiconductor fabrication processes are generally capable of and allow for appropriate device sizing for operational considerations. The memory cell architectures also allow for mitigation of disturb and overerasure issues by placing the floating gate memory cells behind select gates that isolate the memory cells from their associated bit lines and/or source lines.

As stated above, as integrated circuit processing techniques improve, manufacturers try to reduce the feature sizes of the devices produced and thus increase the density of the IC circuits and memory arrays. In many cases, the feature sizes of the devices are limited by the device characteristics before the minimum feature size that the process is capable of is reached. In both NAND and NOR architecture EEPROM memory arrays, as the channel length is reduced and the spacing between memory cells in the strings are reduced, a minimum size is reached that is primarily dictated by the operational characteristics of the floating gate memory cell devices that make up the memory array. As a result, the maximum density of an array of memory cells is limited even if the process technology can attain even smaller features and/or channel lengths. In particular, this is an issue in higher capacity memory types where small changes in the memory cell footprint (e.g., memory cell channel widths) and the cell density in the array can have a large effect on the overall array size and the resulting storage capacity.

As stated above, programming a floating gate memory cell involves the insertion and storage of charge on the memory cell's floating gate. Typically, a floating gate memory cell electrically operates as an enhancement type MOS transistor, requiring a positive voltage applied across the gate and channel to flow current. The presence, or lack thereof, of a trapped charge on the floating gate of the floating gate transistor/memory cell alters the threshold voltage characteristics of this transistor and thus the amount of current the transistor will flow at a given gate channel voltage. The effective threshold voltage of the floating gate transistor memory cell increases with storage of electrons on the floating gate and decreases with the removal of stored charge. Reading floating gate memory cells in EEPROM memory arrays is then accomplished by accessing a memory cell with selected read voltage levels on the control gate and source line. The stored data is then typically sensed from the amount of current the floating gate memory cell flows through the coupled bit line.

In programming floating gate memory cells in EEPROM memory arrays, electrons are typically transferred to the floating gate of the memory cell by one of Fowler-Nordheim tunneling (FN-Tunneling) or channel hot electron injection (HEI). Other forms of programming floating gate memory cells, such as, substrate enhanced hot electron injection (SEHE), are also known and utilized. FN-Tunneling is typically accomplished by applying a positive control gate voltage on the floating gate memory cell with respect to its substrate or surrounding P-well to tunnel inject electrons to the floating gate. Channel hot electron injection (HEI) is typically accomplished by applying a positive voltage on the control gate and drain of the floating gate memory cell and a low voltage or ground on the source to inject electrons to the floating gate. In many cases the programming voltages are iteratively pulsed and the memory cell read to check the programming process and more accurately program the floating gate memory cell.

Erasure of the floating gate memory cells of EEPROM memory arrays is typically accomplished by conventional tunneling or negative voltages applied to the control gate voltages with respect to the substrate or surrounding isolation P-well. Alternatively, other forms of erasure, such as, substrate enhanced band to band tunneling induced hot hole injection (SEBBHH) can also be used for floating gate memory cell erasure. To ensure uniformity, in many cases the EEPROM memory programs all the floating gate memory cells in the data segment to be erased before applying the voltages to erase the memory cells. As with programming, the erasure voltages are typically iteratively pulsed and the memory cells checked after each pulse to verify erasure and return of the floating gate memory cells to an un-programmed threshold voltage state.

Unfortunately, it is possible, during an erasure process, for too much charge to be removed from the floating gate of a floating gate memory cell transistor placing it in to an "overerased" state. In such cases, enough charge is removed that the threshold voltage of the floating gate memory cell transistor is altered so that it operates as a depletion mode device, requiring a negative control gate-channel voltage to be applied to shut off current flow. In this state, the floating gate memory cell transistor will flow a current even when it has not been selected by the memory, unless a negative voltage is applied to the control gate with respect to the source. This "overerased" state and the resulting current flow when the overerased floating gate memory cell is unselected can interfere with attempts to read the values of other floating gate memory cells that share the common bit lines with it, corrupting the read data.

Complicating the issue of overerasure in floating gate memory cells is that not all floating gate memory cells erase (remove charge from their floating gates) at the same rate of speed. Typically, one or more "fast erasing" memory cells will erase more quickly than the others of the group of cells selected for erasure. To minimize the possibility of inadvertently overerasing this group of fast erasing floating gate memory cells most EEPROM and Flash memory devices/arrays typically utilize the complex and time consuming iterative erase voltage pulse-memory cell verify process noted above to erase its floating gate memory cells.

Figure 1B:
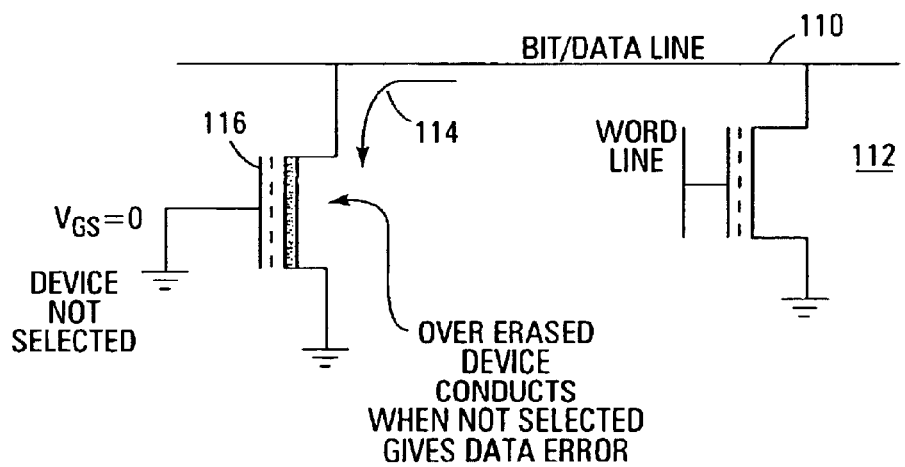

FIG. 1A details a chart of a distribution of threshold voltages 100 of floating gate memory cells in a given array, showing distribution bell curves of the threshold voltages of floating gate memory cells placed in a programmed 102 and erased 104 state as might be typical of a floating gate memory device. FIG. 1A also details a number of erased cells that have been inadvertently placed in an overerased (depletion mode) 106 state. FIG. 1B details a bit line 10 of a memory array 112 and the current flow 114 through an overerased floating gate memory cell 116 that has not been selected/activated for reading.

An additional issue that can affect the memory cells of an EEPROM or Flash memory array is "disturb." Disturb typically happens when the elevated voltages used to program or erase a floating gate memory cell segment or erase block "disturb" the programmed values stored in other floating gate memory cells corrupting them and causing errors when they are later read. These inadvertently disturbed cells typically share common word lines, bit lines, or source lines with the memory cells that are being programmed or erased.

By constructing their floating gate memory cells vertically and isolating them with select gates, embodiments of the present invention allow for increases in memory array cell density and improved utilization of process minimum feature size capabilities, while maintaining the size of the memory cell channel to allow for appropriate device operation. In addition, by increasing the available surface area for transistors and incorporating select gates, which are also constructed in a vertical manner, embodiments of the present invention mitigate issues with overerasure and disturb, allowing for greater reliability and faster programming and erasure.

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

An EEPROM or Flash NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 2A:
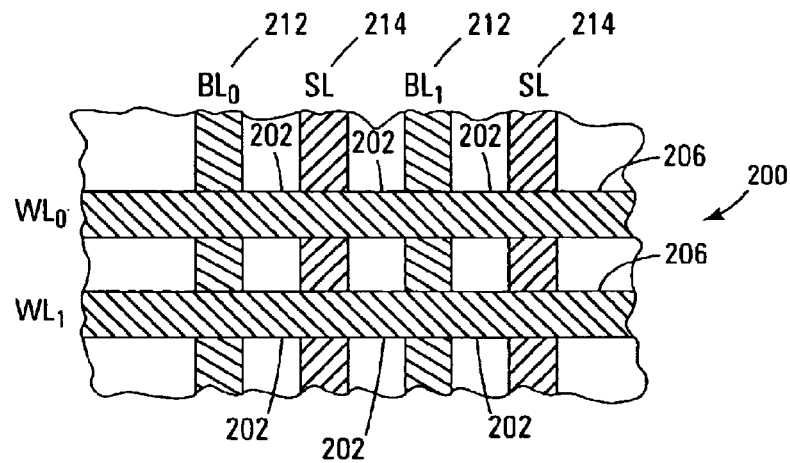
FIGS. 2A–2C detail a planar NAND floating gate memory array of the prior art.
Figure 2B:
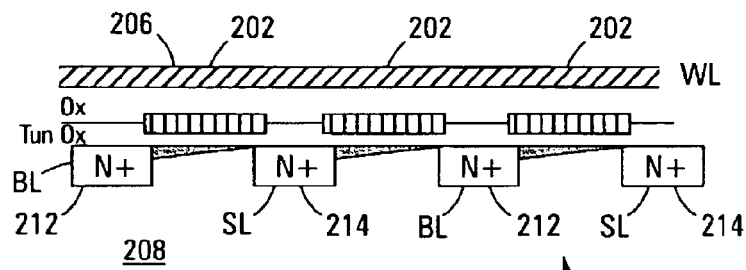
Figure 2C:
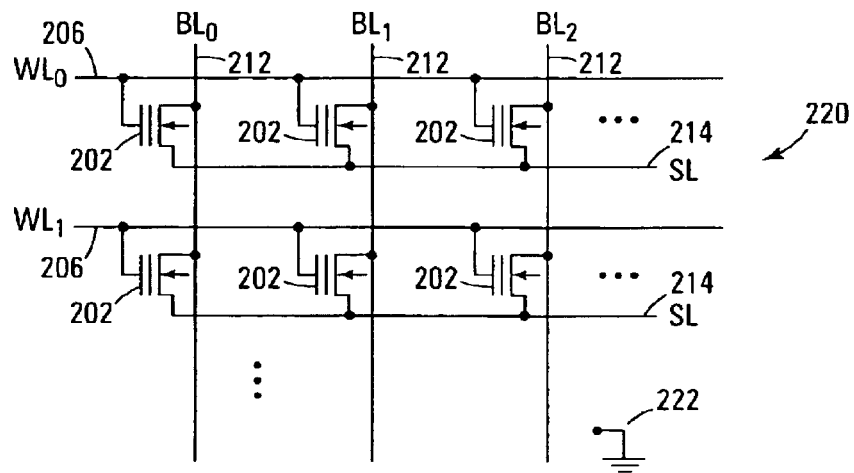

FIGS. 2A, 2B, and 2C show a simplified planar NOR floating gate memory array of a EEPROM or Flash memory device of the prior art. FIG. 2A details a top view of a planar NOR architecture floating gate memory array 200, a side view of the planar NAND floating gate memory array 200 is detailed in FIG. 2B. In FIGS. 2A and 2B, floating gate memory cells 202 are coupled together in a NOR architecture memory array having bit lines 212, source lines 214, and word lines 206. The bit lines 212 and source lines 214 are formed locally from N+ doped regions deposited in the substrate 208. Each floating gate memory cell 202 has a gate-insulator stack formed between the N+ doped regions of a bit line 212 and a source line 214, utilizing the N+ doped regions as a drain and source respectively. The gate-insulator stack is made of a tunnel insulator on top of a substrate 208, a floating gate formed on the tunnel insulator, an intergate/interpoly insulator formed over the floating gate, and a control gate 206 (typically formed integral to the word line 206, also known as a control gate line) formed over the intergate/interpoly insulator. FIG. 2C details an equivalent circuit schematic 220 of the NOR architecture floating gate memory array 200, showing floating gate memory cells 202 coupled to the bit lines, source lines, word lines, and substrate connection 222.

Figures 3A, 3B:
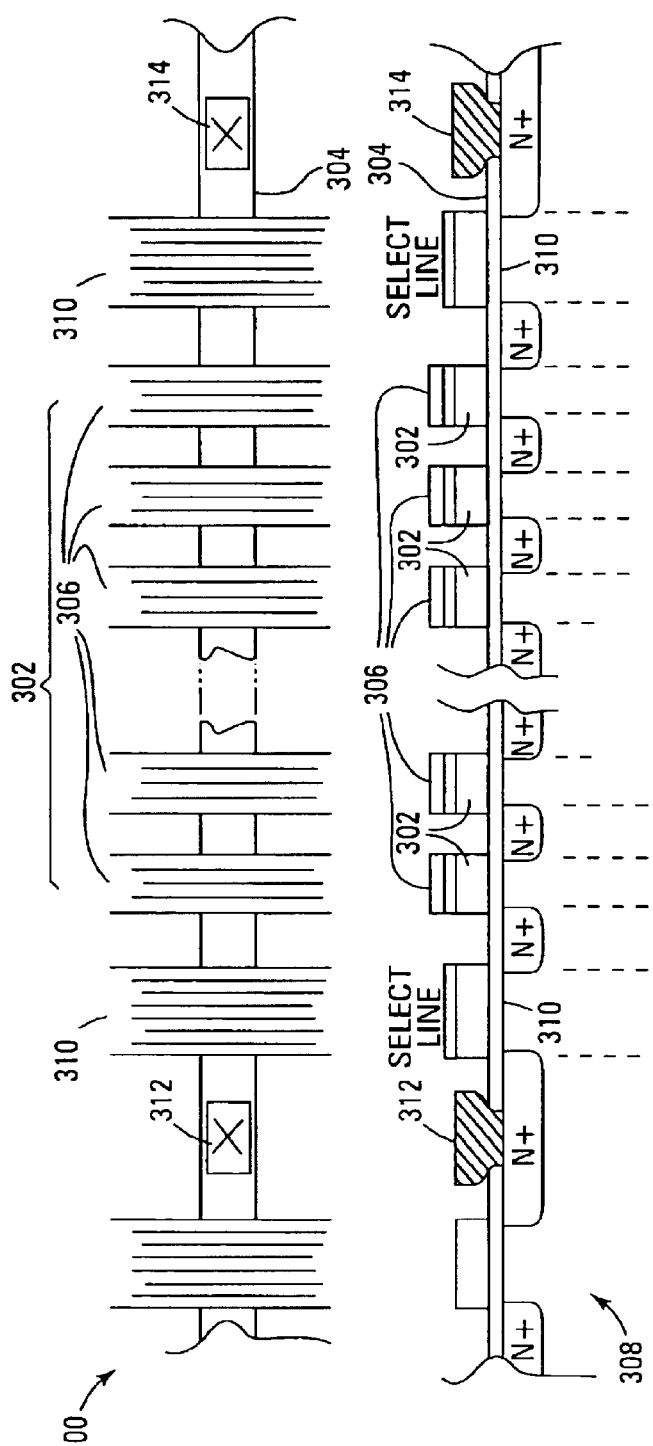
FIGS. 3A–3C detail a planar NOR floating gate memory array of the prior art.
Figure 3C:
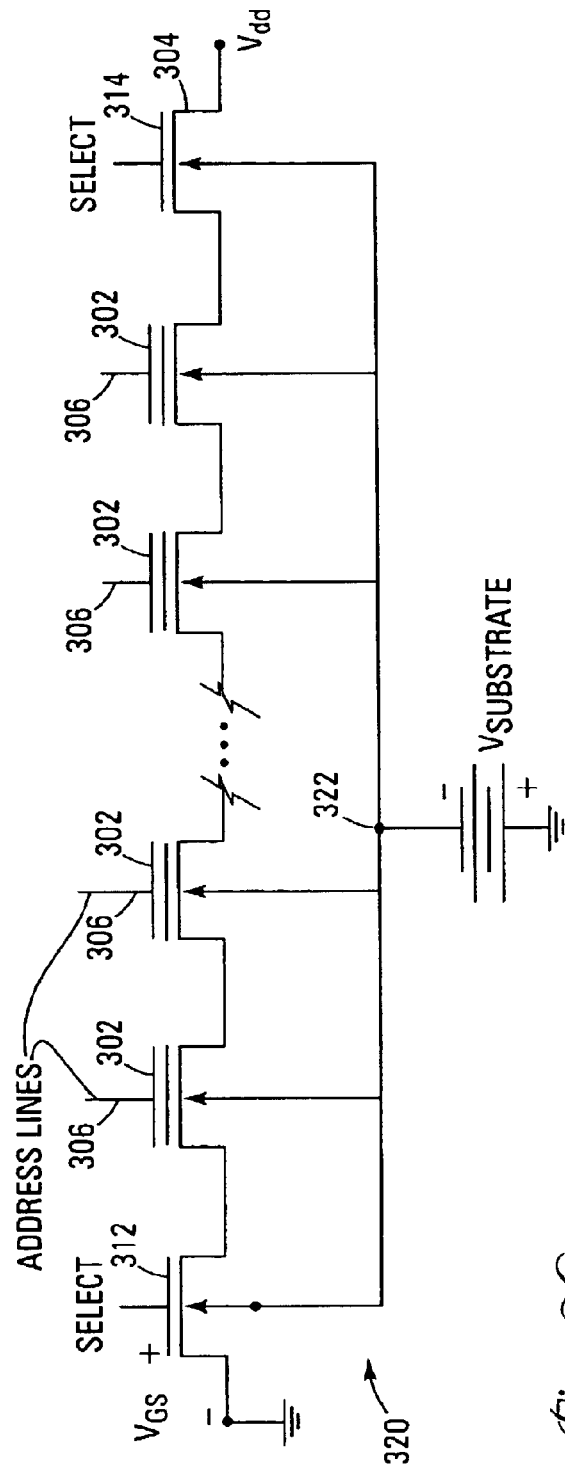

FIGS. 3A, 3B, and 3C show a simplified planar NAND floating gate memory array of a EEPROM or Flash memory device of the prior art. FIG. 3A details a top view of a planar NAND floating gate memory string 304 of a NAND architecture floating gate memory array 300, a side view of the planar NAND floating gate memory string 304 is detailed in FIG. 3B. In FIGS. 3A and 3B, a series of floating gate memory cells 302 are coupled together in a series NAND string 304 (typically of 8, 16, 32, or more cells). Each floating gate memory cell 302 has a gate-insulator stack that is made of a tunnel insulator on top of a substrate 308, a floating gate formed on the tunnel insulator, an intergate/interpoly insulator formed over the floating gate, and a control gate 306 (typically formed in a control gate line, also known as a word line) formed over the intergate/interpoly insulator. N+ doped regions are formed between each gate insulator stack to form the source and drain regions of the adjacent floating gate memory cells, which additionally operate as connectors to couple the cells of the NAND string 304 together. Select gates 310, that are coupled to gate select lines, are formed at either end of the NAND floating gate string 304 and selectively couple opposite ends of the NAND floating gate string 304 to a bit line contact 312 and a source line contact 314. FIG. 3C details an equivalent circuit schematic 320 of the NAND architecture floating gate memory string 304, showing floating gate memory cells 302 and substrate connection 322.

Embodiments of the present invention utilize vertical floating gate memory cells and vertical gate structures. Methods of forming vertical memory cells are detailed in U.S. Pat. No. 5,936,274, titled "High density flash memory", issued Aug. 10, 1999, which is commonly assigned. Methods of forming vertical split control gates are detailed U.S. Pat. No. 6,150,687, titled "Memory cell having a vertical transistor with buried source/drain and dual gates", issued Nov. 21, 2000, and U.S. Pat. No. 6,072,209, titled "Four $F^2$ folded bit line DRAM cell structure having buried bit and word lines", issued Jun. 6, 2000, which are also commonly assigned.

Figure 4A:
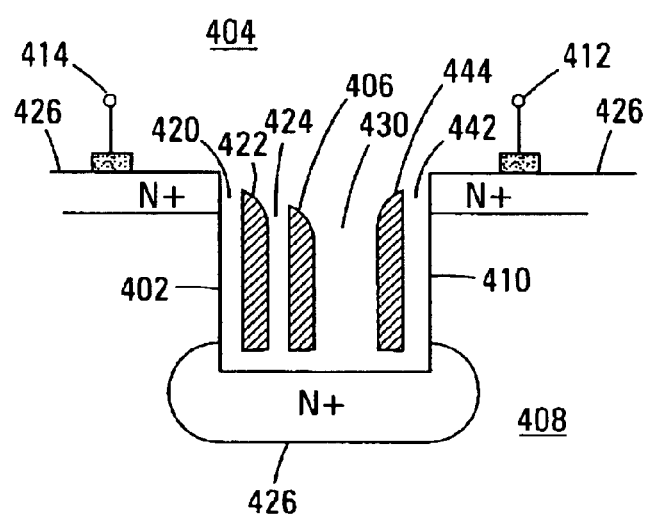
FIGS. 4A–4C detail vertical NOR floating gate memory array and cells in accordance with embodiments of the present invention.
Figure 4B:
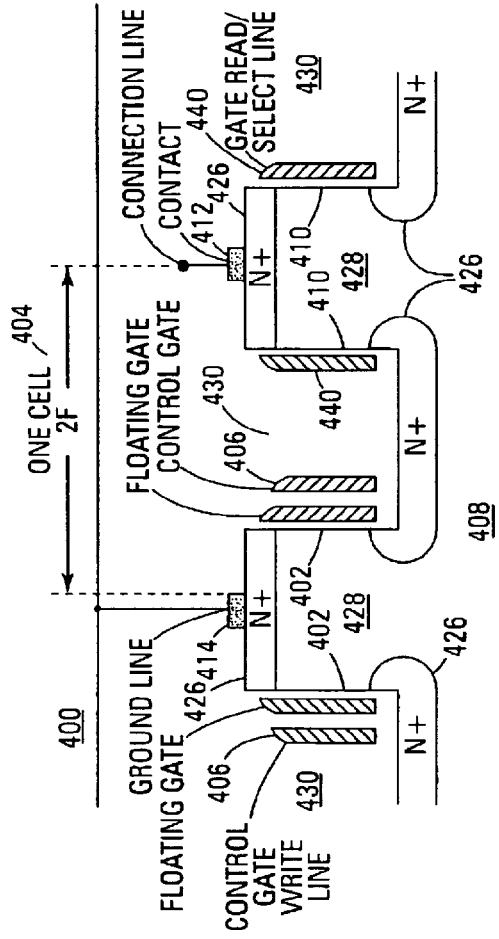
Figure 4C:
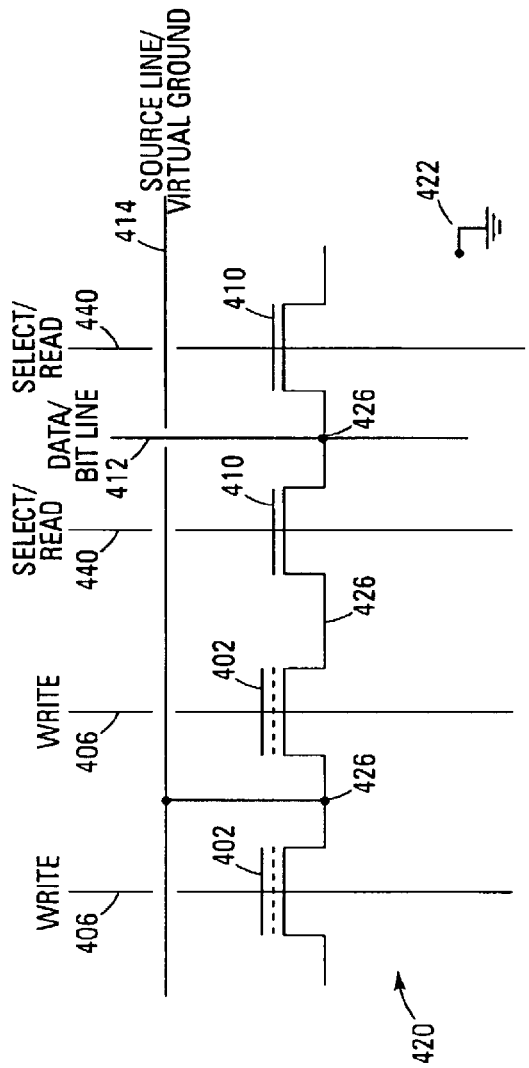

FIGS. 4A–4C detail vertical floating gate memory cells and select gates for a NOR architecture floating gate memory array in accordance with embodiments of the present invention. FIG. 4A details a side view of a simplified vertical NOR architecture memory cell structure 404, a side view of a vertical NOR memory array 400 is detailed in FIG. 4B. FIG. 4C details an equivalent circuit schematic 420 of the vertical NOR architecture floating gate memory array 400, showing floating gate memory cells 402 and substrate connection 422. It is noted that the NOR architecture floating gate memory array 400 can be utilized in both EEPROM or Flash memories arrays and devices. As can be seen from FIGS. 4A and 4B, in a single vertical NOR architecture memory cell structure 404, two vertically formed transistors occupy the area that a single planar floating gate transistor would occupy (an area of 4F squared when viewed from above, each transistor having an area of 2F squared). Where "F" is the minimum resolvable photolithographic dimension in the particular process technology.

In FIG. 4A, a vertically formed floating gate memory cell 402 and select gate 410 are coupled together in series in a vertical NOR architecture memory cell structure 404. In creating the vertical NOR architecture memory cell structure 404 a trench 430 is formed in a substrate 408. The vertical floating gate memory cell 402 and select gate 410 are then formed on the sidewalls of the trench 430. The vertical floating gate memory cell 402 has a gate-insulator stack made of a tunnel insulator 420 formed on the surface of the sidewall, a floating gate 422 (typically of polysilicon) formed on the tunnel insulator 420, an intergate/interpoly insulator 424 formed over the floating gate 422, and a control gate 406 (typically formed in a control gate line, also known as a word line) formed over the intergate/interpoly insulator 424. In one embodiment, the substrate trench 430 is formed by patterning a masking material that is layered over the substrate 408 and anisotropically etching the trenches 430. The gate-insulator stack of the floating gate memory cell 402 is formed in one embodiment by successive layering of each of the materials of the gate insulator stack over the trench 430, followed by a mask and directional etch of the deposit of each layer to leave only the material deposited on the sidewall of the trench 430. In another embodiment, differing layers of the gate-insulator stack are formed and then masked and directionally etched in a single step.

The vertical select gate 410 has a gate-insulator stack made of an insulator 442 formed on the opposite sidewall of the trench 430 with a control gate 444 formed over the insulator 442. The gate-insulator stack of the select gate 410 is formed by successive layering of each of the materials of the gate insulator stack over the trench 430, as with the vertical floating gate memory cell 402, but skips the depositing of the tunnel insulator 420 and floating gate 422 layers. In one embodiment of the present invention the tunnel insulator 420 and the floating gate 422 of the floating gate memory cell 402 are formed and then the intergate/interpoly insulator 424/control gate 406 of the floating gate memory cell 402 and the insulator 442/control gate 444 of the select gate 410 are formed consecutively.

N+ doped regions 426 are formed at the raised areas at the top and at the bottom of the trenches 430 to form the source and drain regions for the vertical floating gate memory cell/gate-insulator stack 402 and select gate 410. The N+ regions also couple the memory cell 402 and select gate 410 together to form the vertical NOR memory structure 404 and additionally couple the vertical NOR architecture memory cell structure 404 to the bit line 412 and source line 414. It is noted that the N+ source/drain regions 426 may be formed before or after the formation of the floating gate memory cell 402 and select gate 410 gate-insulator stacks.

In FIG. 4B, a vertical NOR architecture floating gate memory array 400 is formed from a series of vertical NOR architecture memory cell structures 404. Each vertical NOR architecture memory cell structures 404 having a vertically formed floating gate memory cell 402 and a coupled select gate 410, wherein the drain of the select gate is coupled to a bit line 412 and the source of the floating gate 402 is coupled to a source line 414.

In creating the vertical NOR architecture floating gate memory array 400 a series of substrate pillars 428 are formed in a substrate 408 with trenches 430 located between them. The vertical floating gate memory cells 402 and select gates 410 are then formed on the sidewalls of the pillars 428 within the trenches 430 to form the vertical NOR architecture memory cell structures 404. The vertical floating gate memory cells 402 and select gates 410 are formed in an alternating pattern (floating gate-select gate, select gate-floating gate, floating gate-select gate, etc.) such that each pillar 428 has either select gates 410 or floating gates formed on its sidewalls.

N+ doped regions 426 are formed at the top of the pillars 428 and at the bottom of the trenches 430 to form the source and drain regions. The N+ regions at the bottom of the trenches 430 couple the memory cell 402 and select gate 410 of each vertical NOR architecture memory cell structure 404 together. The N+ regions at the tops of the pillars 428 couple the drain of the select gate 410 and the source of the floating gate memory cell 402 of each vertical NOR architecture memory cell structure 404 to the bit lines 412 and source lines 414 respectively, so that the N+ regions on the top of the pillars 428 are coupled to either a source line 414 or a bit line 412. It is again noted that the N+ source/drain regions 426 may be formed before or after the formation of the floating gate memory cell 402 and select gate 410 gate-insulator stacks.

It is also noted that isolation regions, typically formed of an oxide insulator, can be used between adjacent rows of vertical NOR architecture memory cell structures 404 to isolate each row from its neighbors. These isolation regions can be extended into the substrate 408 to allow the formation of P-wells, where each P-well contains a single row of vertical NOR architecture memory cell structures 404 that can be biased in isolation from the other rows of the array 400. It is also noted that the control gate/word address lines 406 and select lines 440 can cross these isolation regions so that each control gate/word address line 406 and select line 440 controls the operation of multiple floating gate memory cells 402 and select gates 410, respectively, across multiple rows of vertical NOR architecture memory cell structures 404.

As stated above, FIG. 4C details an equivalent circuit schematic 420 of the vertical NOR architecture floating gate memory array 400, showing floating gate memory cells 402 and substrate connection 422. The vertical floating gate memory cells 402 and select gates 410 are formed in an alternating pattern (floating gate-select gate, select gate-floating gate, floating gate-select gate, etc.) so that the drain of the select gate 410 and the source of the floating gate memory cell 402 of each vertical NOR architecture memory cell structure 404 is coupled to a bit line 412 or a source line 414 respectively.

In the vertical NOR architecture floating gate memory array 400 of FIGS. 4A–4C, the channel length of each floating gate memory cell 402 and select gate 410 in a vertical NOR architecture memory cell structure 404 is determined by the depth of the trenches 430 and not by the minimum feature size. Due to the vertical form of the vertical NOR architecture floating gate memory array 400 and vertical NOR architecture memory cell structures 404 of embodiments of the present invention, a NOR architecture floating gate memory array can be produced that contain a vertical floating gate memory cell 402 and a coupled select gate 410 in the space that would be utilized by a single conventional planar floating gate memory cell.

The addition of a select gate 410 coupled between the bit line 412 and the drain of each floating gate memory cell 402 allows for the floating gate memory cell 402 to be isolated from the bit line 412 and thus has advantages in both programming and erasing the floating gate memory cells 402 of the vertical NOR architecture floating gate memory array 400. In erasing, the coupled select gate 410 allows for avoidance of overerasure issues with floating gate memory cells 402 by isolating each memory cell 402 behind a select gate 410 so that, even if a floating gate memory cell 402 is overerased into depletion mode, it will not corrupt the reading of other memory cells 402 on its bit line 412 by flowing current. As the possibility of corruption of data reads due to overerasure is mitigated, this allows for the NOR architecture floating gate memory array 400 to speed up its erasure processes by using larger erase pulses (in time or voltage) or even utilizing only a single erase pulse. In addition, by allowing the increase of erasure pulse time and voltage, the number of erasure verifications required are reduced or even eliminated. The coupled select gate 410 also allows for the isolated erasure of one or more floating gate memory cells 402 allowing erasure of individual floating gate memory cells 402, one or more selected data words, data segments, or erase blocks.

In programming, the coupled select gate 410 allows for mitigation of programming disturb of floating gate memory cells 402 in the array 400 by the select gate 410 isolating the memory cells 402 from the bit line 412. This allows for longer and higher voltage programming pulses to be used without increasing the possibility of disturb issues.

Figure 5A:
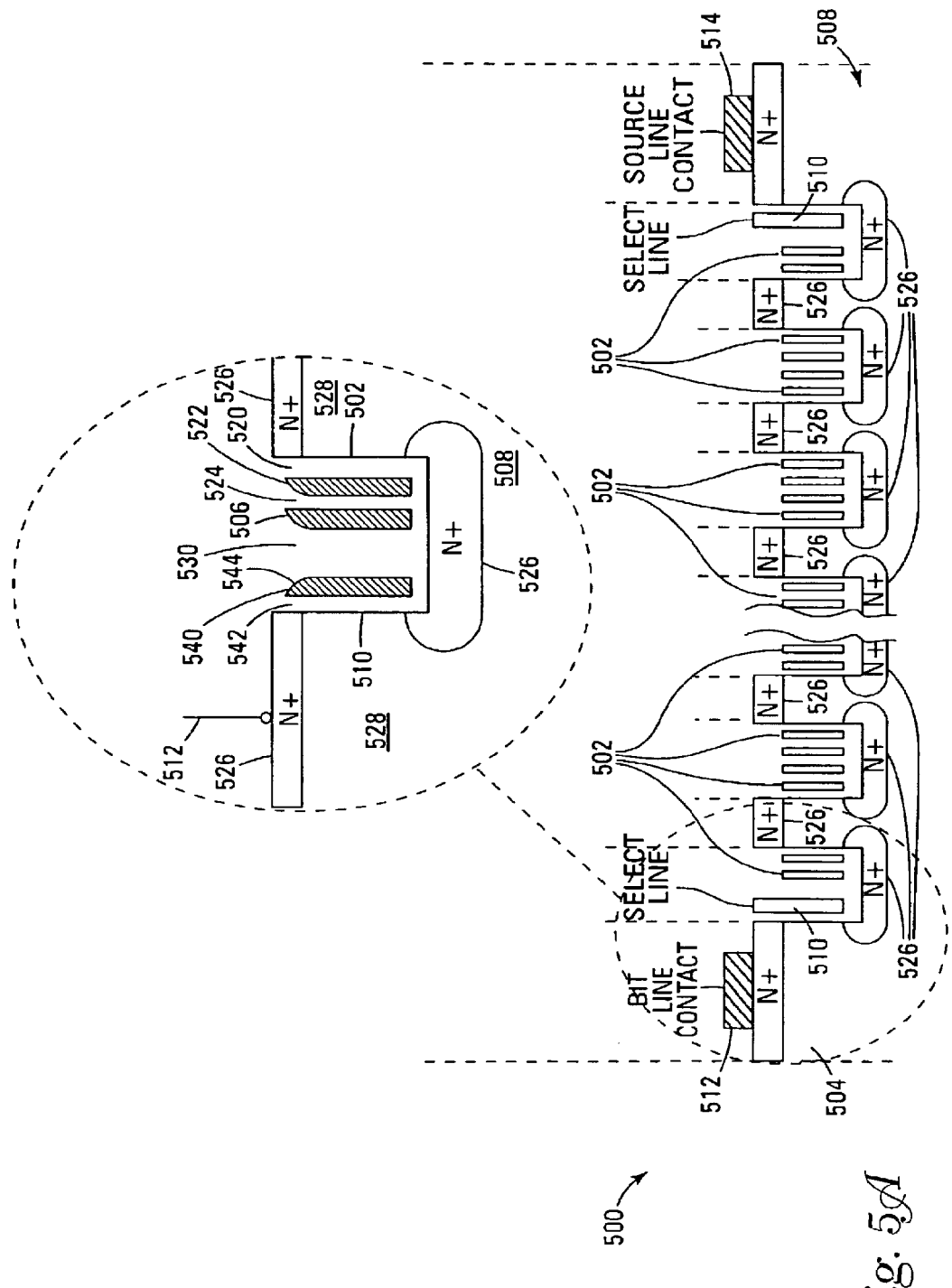
FIGS. 5A–5D detail vertical NAND floating gate memory array and cells in accordance with embodiments of the present invention.
Figure 5B:
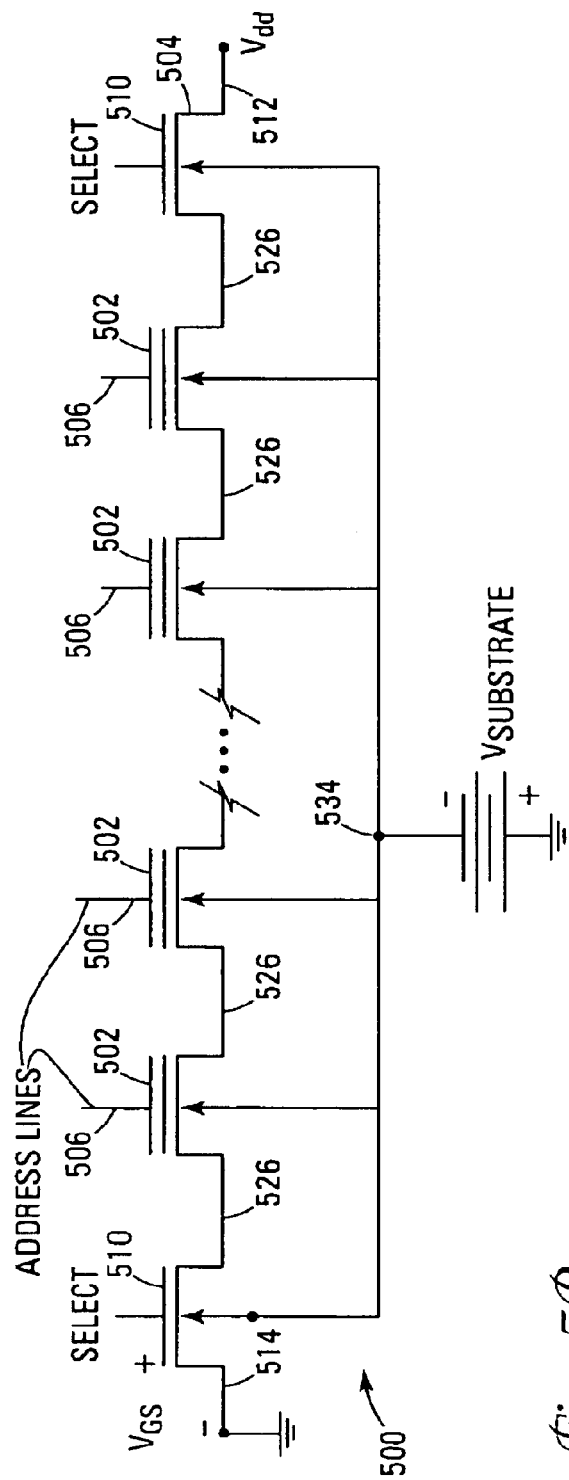
Figure 5C:
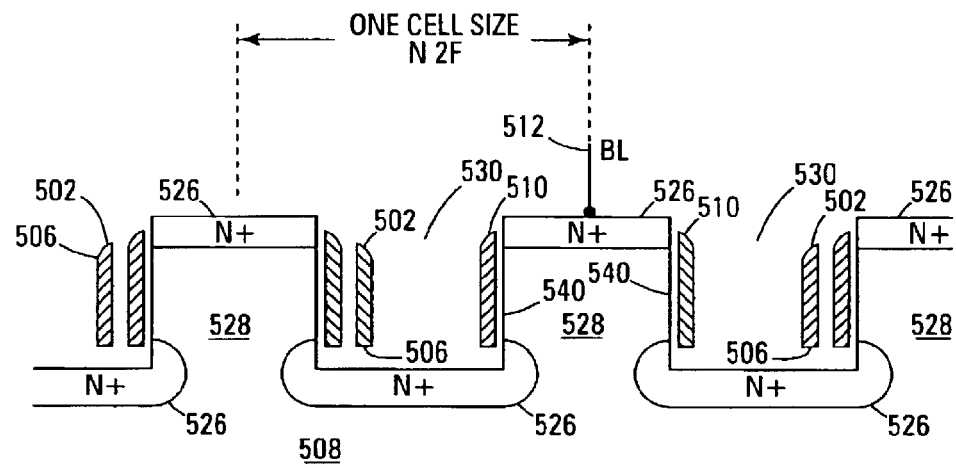

FIGS. 5A–5D detail vertical floating gate cells, vertical select gates, and NAND architecture floating gate memory strings in accordance with embodiments of the present invention. FIG. 5A details a side view of a simplified vertical NAND architecture floating gate memory string 504 with vertical select gates 510. FIG. 5B details an equivalent circuit schematic 520 of the vertical NAND architecture floating gate memory string 504, showing floating gate memory cells 502 and substrate connection 534. FIG. 5C details a side view of a simplified vertical NAND architecture floating gate memory array 500 and FIG. 5D details an equivalent circuit schematic of one embodiment of the present invention. Again, as can be seen from FIGS. 5A and 5C, in a vertical NAND architecture memory string 504, two vertically formed transistors occupy the area that each planar transistor would occupy (an area of 4F squared when viewed from above, each transistor having an area of 2F squared). Where "F" is the minimum resolvable photolithographic dimension in the particular process technology. Since each transistor can store a single bit of data the data storage density is one bit for each 2F squared unit area. Thus, for example, if F=0.1 micron then the storage density is 0.5 Giga bit per square centimeter.

In FIG. 5A, a series of vertically formed floating gate memory cells 502 are coupled together in a series floating gate NAND string 504 (typically of 8, 16, 32, or more cells). In the vertical NAND floating gate memory array string 504 of FIGS. 5A–5D, a series of substrate pillars 528 are formed in a substrate 508 with trenches 530 located between them. The vertical floating gate memory cells 502 are then formed on the sidewalls of the pillars 528 within the trenches 530. Each vertical floating gate memory cell 502 is formed on the sidewalls of the substrate pillars 528 (for two floating gate memory cells 502 per trench 530) and has a gate-insulator stack made of a tunnel insulator 520 formed on the surface of the sidewall, a floating gate 522 (typically of polysilicon) formed on the tunnel insulator 520, an intergate/interpoly insulator 524 formed over the floating gate 522, and a control gate 506 (typically formed in a control gate line, also known as a word line) formed over the intergate/interpoly insulator 524.

In one embodiment the substrate pillars 528 and trenches 530 are formed by patterning a masking material that is layered over the substrate 508 and anisotropically etching the trenches 530. The gate-insulator stack of each floating gate memory cell 502 are formed in one embodiment by successive layering of each of the materials of the gate insulator stack over the pillars 528 and trenches 530, followed by a mask and directional etch of the deposit of each layer to leave only the material deposited on the sidewall of the pillars 528. In another embodiment, differing layers of the gate-insulator stack are formed and then masked and directionally etched in a single step.

N+ doped regions 526 are formed at the top of the substrate pillars 528 and at the bottom of the trenches 530 between each vertical floating gate memory cell/gate-insulator stack 502 to form the source and drain regions of the adjacent floating gate memory cells 502 and couple the memory cells 502 together to form the vertical NAND architecture memory string 504. It is noted that the N+ source/drain regions 526 may be formed before or after the formation of the floating gate memory cells/gate-insulator stack 502.

Select gates 510, that are coupled to gate select lines, are formed at either end of the NAND floating gate memory string 504 and selectively couple opposite ends of the NAND floating gate memory string 504 to a bit line contact 512 and a source line contact 514. The vertical select gates 510 have a gate-insulator stack made of an insulator 542 formed on a sidewall with a control gate 544 formed over the insulator 542. The gate-insulator stack of the select gates 510 are formed by successive layering of each of the materials of the gate insulator stack over the pillars 528 and trenches 530, as with the vertical floating gate memory cell 502, but skips the depositing of the tunnel insulator 520 and floating gate 522 layers. The N+ regions 526 also couple the first and last memory cell 502 of the vertical NAND architecture floating gate string 504 to the select gates 510 and additionally couple the vertical NAND architecture floating gate string 504 to the bit line 512 and source line 514.

As stated above, FIG. 5B details an equivalent circuit schematic of the vertical NAND architecture floating gate memory array 500, showing the vertical floating gate memory cells 502, select gates 510, bit line 512 and source line 514 connections, and substrate connection 534, in accordance with embodiments of the present invention. As can be seen, the schematic provides the same equivalent circuit as that of a conventional planar NAND architecture floating gate memory string.

In FIG. 5C, a section of vertical NAND architecture floating gate memory array 500 of one embodiment of the present invention is formed from a series of vertical NAND architecture floating gate memory cell strings 504. In FIG. 5C, each pair of adjacent vertical NAND architecture floating gate memory cell strings 504 in the vertical NAND architecture floating gate memory array 500 are coupled through vertical select gates 510 to a common bit line 512 by a N+ doped region 526 formed at the top of a pillar 528.

It is also noted that isolation regions, typically formed of an oxide insulator, can be used between vertical NAND architecture floating gate memory cell strings 504 to isolate each string 504 from its neighbors. These isolation regions can be extended into the substrate 508 to allow the formation of P-wells, where each P-well contains a single vertical NAND architecture floating gate memory cell string 504 that can be biased in isolation from the other strings or rows of the array 500. It is also noted that the control gate/word address lines 506 and select lines 540 can cross these isolation regions so that each control gate/word address line 506 and select line 540 controls the operation of floating gate memory cells 502 and select gates 510 respectively across multiple rows of vertical NAND architecture floating gate memory cell strings 504.

Figure 5D:
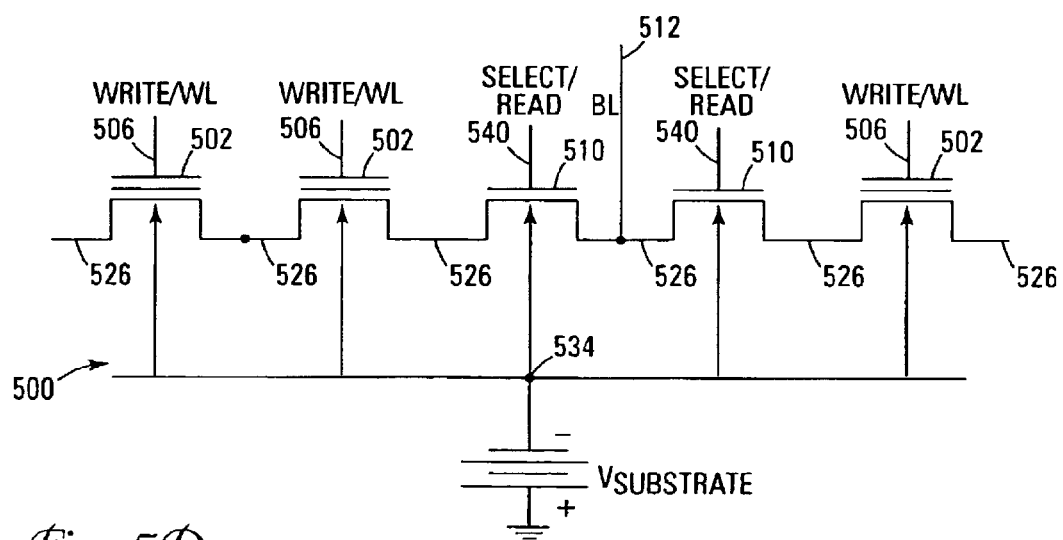

As stated above, FIG. 5D details an equivalent circuit schematic of the vertical NAND architecture floating gate memory array of FIG. 5C, showing floating gate memory cells 502 and adjacent sting 504 connection.

In the vertical NAND architecture floating gate memory array 500 of FIGS. 5A–5D, the channel length of each floating gate memory cell 502 and select gate 510 in a vertical NAND architecture memory string 504 is determined by the depth of the pillars 528 and trenches 530 and not by the minimum feature size. Due to the vertical form of the NAND architecture floating gate memory array 500 and NAND architecture memory strings 504 of embodiments of the present invention, a vertical NAND architecture floating gate memory array string 504 and select gates 510 can be produced that typically has twice the density for a given string horizontal run length than a corresponding planar NAND architecture floating gate memory array string.

The addition of a select gates 510 coupled between the bit line 512, source line 514, and the floating gate memory cells 502 of the vertical NAND architecture memory string 504 allows for the floating gate memory cells 502 of the vertical NAND architecture memory string 504 to be isolated from the bit line 512 and/or source line 514 and thus has advantages in both programming and erasing the vertical NAND architecture memory string 504. In erasing, the coupled select gates 510 allows for avoidance of overerasure issues with floating gate memory cells 502 by isolating each vertical NAND architecture memory string 504 behind one or more select gates 510 so that even if the floating gate memory cells 502 of the vertical NAND architecture memory string 504 are overerased into depletion mode operation they will not corrupt the reading of other memory cells 502 on other vertical NAND architecture memory strings 504 that are coupled to its bit line 512. As the possibility of corruption of data reads due to overerasure is mitigated, this allows for the vertical NAND architecture floating gate memory array 500 to speed up erasure processes by using larger erase pulses or even a single erase pulse and by reducing or eliminating erasure verification. The coupled select gates 510 also allow for the isolated erasure of one or more floating gate memory cells 502 allowing erasure of individual floating gate memory cells 502, individual vertical NAND architecture memory strings 504, one or more selected data words, or erase blocks. In programming, the coupled select gates 510 allow for mitigation of programming disturb of floating gate memory cells 502 in the array 500 by the select gates 510 isolating the memory cells 502 of the vertical NAND architecture memory strings 504 from the bit line 512 and the source line 514. This allows for longer and higher voltage programming pulses to be used without an increased issue with of disturb problems.

Figure 6A:
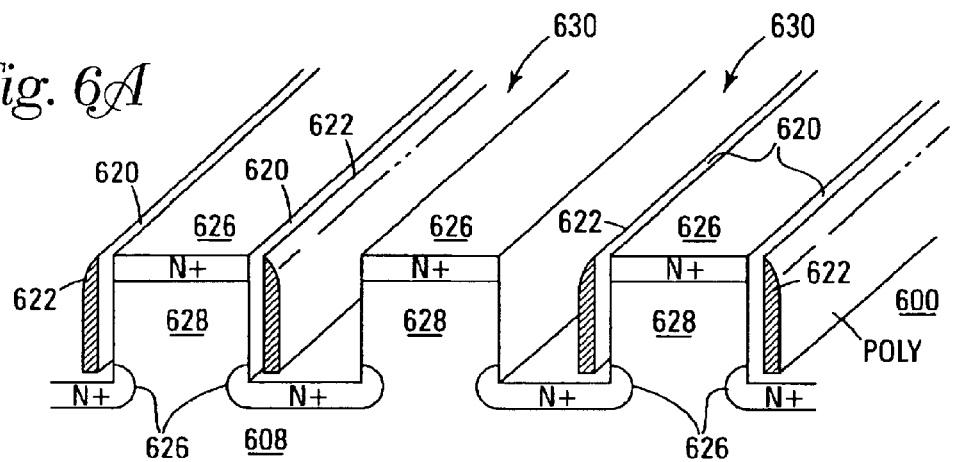
FIGS. 6A–6C detail formation of a vertical NAND architecture floating gate memory array having floating gates and select gates in accordance with embodiments of the present invention.
Figure 6B:
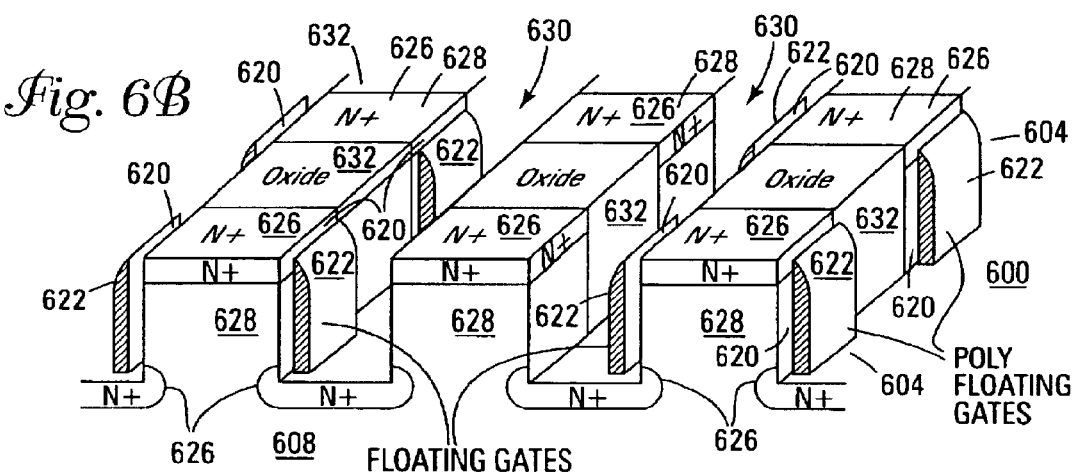
Figure 6C:
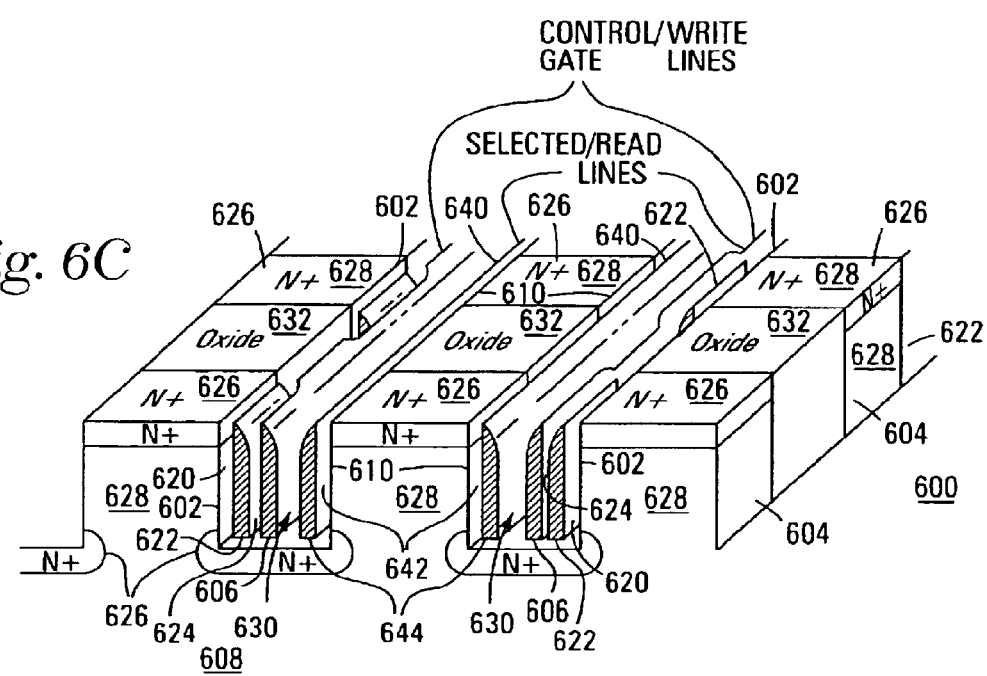

FIGS. 6A–6C detail three dimensional views of vertical floating gate cells 602 and vertical select gates 610 of a vertical NAND floating gate memory array 600 in accordance with embodiments of the present invention at several mid-fabrication stages. It is noted that a formation process that is similar to the NAND process may be utilized for formation of a vertical NOR floating gate memory array 400 with the exception of placement and number of the select gates 610 and bit line and source line contacts. As stated above, in creating the vertical NAND floating gate memory array 600, a series of substrate pillars 628 are formed in a substrate 608 with trenches 630 located between them. The vertical floating gate memory cells 602 and select gates 610 are then formed on the sidewalls of the pillars 628 within the trenches 630. Between successive rows of substrate pillars 628, isolation regions 632 have been formed on the faces of the pillars 628 that are not utilized to form floating gate memory cells 602 or select gates 610 to isolate each row of vertical NAND floating gate memory strings 604 from the neighboring rows. These isolation regions 632 are typically formed of an oxide insulator.

As stated above, in creating each floating gate memory cell gate-insulator stack 602, a tunnel insulator 620 is formed on the surface of the sidewall, a floating gate 622 is formed on the tunnel insulator 620, an intergate/interpoly insulator 624 is formed over the floating gate 622, and a control gate 606 is formed over the intergate/interpoly insulator 624. In creating each select gate gate-insulator stack 610, an insulator 642 is formed on the surface of the sidewall, and a control gate 644 is formed over the insulator 642.

In FIG. 6A, the trenches 630 have been already formed by masking and anisotropically/directionally etching the trenches 630 in the substrate 608. N+ doped regions 626 have been formed at the top of the unformed substrate pillars 628 and at the bottom of the trenches 630 to form the source/drain regions of the floating gate memory cells 602. The gate-insulator stack of each floating gate memory cell 602 have been partially formed on the sidewalls of the trenches 630. In each trench 630, with the exception of the pillar 628 on which the select gates 610 are to be formed, are formed the tunnel insulator 620, the floating gate 622, and the intergate/interpoly insulator 624, by successive depositing, masking, and directional etching of layers of material.

In FIG. 6B, the pillars 628 are formed and the space between each pillar in successive rows of NAND architecture floating gate memory strings 604 are filled with an oxide to form isolation regions 632. In forming the pillars 628, the rows of NAND architecture floating gate memory strings 604 are masked and directionally etched. This masking and etching process also divides the floating gate layer into individual floating gates 622.

In FIG. 6C, the control gates/word lines 606 and select gates 610/select lines 640 are formed. In forming the control gates/word lines 606 and select gates 610/select lines 640, successive layers of insulator and polysilicon which will form the control gates/word lines 606 and select gates 610/select lines 640 is deposited over the pillars 628, trenches 630, and partially formed gate-insulator stacks of the floating gale memory cells 602 of the memory array 600. A layer of masking material is then formed over the polysilicon layer and patterned. The excess masking material is removed and the memory array 600 is anisotropically/directionally etched to remove the undesired portions of the deposited polysilicon and form the control gates/word lines 606 and select gates 610/select lines 640 on the sidewalls of the pillars 628 and trenches 630.

It is noted that the isolation regions 632 between the vertical NAND architecture floating gate strings 604 can be extended into the substrate 608 to allow the formation of P-wells, where each P-well contains a single NAND string 604 and can be biased in isolation from the other strings 604 of the array 600. It is also noted that the control gates/word lines 606 and select gates 610/select lines 640 cross these isolation regions 632 so that each control gate/word address line 606 controls the operation of floating gate memory cells 602 and each select line 640 the operation of select gates 610 across multiple NAND memory strings 604.

In FIGS. 6A–6C, the substrate 608 of the vertical NAND architecture floating gate memory array 600 is P-doped. A substrate connection can be utilized that can allow for biasing of the P-doped substrate 608. It is noted that other forms of substrate doping, substrate biasing, and substrate types and regions (including, but not limited to silicon-on-sapphire (SOS) technology, silicon-on-insulator (SOI) technology, thin film transistor (TFT) technology, doped and undoped semiconductors, epitaxial layers of silicon supported by a base semiconductor) in embodiments of the present invention are possible and should be apparent to those skilled in the art with the benefit of the present invention.

As noted above the programming of the floating gate memory cells of the vertical NAND and NOR architecture memory structures, strings, and arrays of embodiments of the present invention can be accomplished by conventional tunnel injection of electrons with a positive gate voltage with respect to the substrate or P-well. In another embodiment of the present invention, programming is accomplished by channel hot electron injection (HEI). Erasure of the floating gate memory cells of embodiments of the present invention can accomplished by conventional tunneling or negative voltages applied to the control gate voltages with respect to the substrate or P-well. In alternative embodiments of the present invention, substrate enhanced hot electron injection (SEHE) can be utilized for floating gate memory cell programming and/or substrate enhanced band to band tunneling induced hot hole injection (SEBBHH) for floating gate memory cell erasure.

Figure 7:
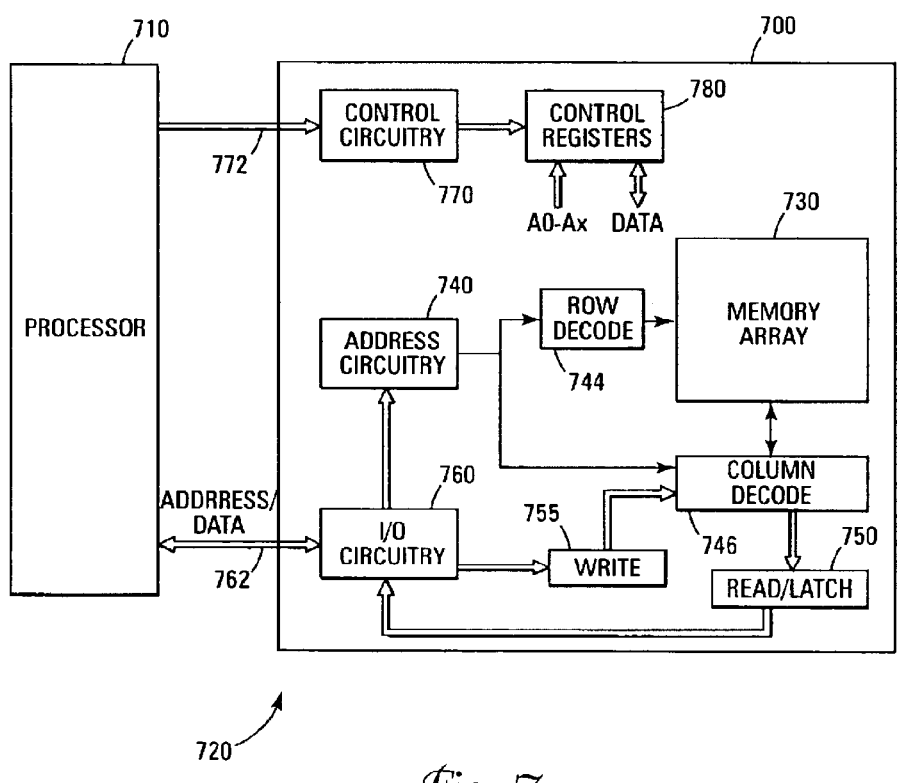
FIG. 7 details a block diagram of an electronic system in accordance with embodiments of the present invention.

FIG. 7 illustrates a functional block diagram of a memory device 700 that can incorporate the vertical NAND architecture floating gate memory array 500 or vertical NOR architecture floating gate memory cell array 400 of the present invention. The memory device 700 is coupled to a processor 710. The processor 710 may be a microprocessor or some other type of controlling circuitry. The memory device 700 and the processor 710 form part of an electronic system 720. The memory device 700 has been simplified to focus on features of the memory that are helpful in understanding the present invention.

The memory device includes an array of vertical floating gate memory cells and select gates 730. In one embodiment, the memory cells are vertical floating gate memory cells and the memory array 730 are arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 740 is provided to latch address signals provided on address/data bus 762. Address signals are received and decoded by a row decoder 744 and a column decoder 746 to access the memory array 730. It will be appreciated by those skilled in the art, with the benefit of the present description, that the size of address input on the address/data bus 762 depends on the density and architecture of the memory array 730. That is, the size of the input address increases with both increased memory cell counts and increased bank and block counts. It is noted that other address input manners, such as through a separate address bus, are also known and will be understood by those skilled in the art with the benefit of the present description.

The memory device 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over a plurality of data connections in the address/data bus 762 with the processor/controller 710. Write circuitry 755 is provided to write data to the memory array.

Control circuitry 770 decodes signals provided on control connections 772 from the processor 710. These signals are used to control the operations on the memory array 730, including data read, data write, and erase operations. The control circuitry 770 may be a state machine, a sequencer, or some other type of controller.

Since the vertical floating gate memory cells of the present invention use a CMOS compatible process, the memory device 700 of FIG. 7 may be an embedded device with a CMOS processor.

The memory device illustrated in FIG. 7 has been simplified to facilitate a basic understanding of the features of the memory. A more detailed understanding of internal circuitry and functions of memories are known to those skilled in the art.

It is also noted that other vertical NAND and NOR architecture floating gate memory strings, arrays, and memory devices in accordance with embodiments of the present invention are possible and should be apparent to those skilled in the art with benefit of the present disclosure.

Conclusion

EEPROM memory devices and arrays have been described that facilitate the use of vertical floating gate memory cells and select gates in NOR or NAND high density memory architectures. Memory embodiments of the present invention utilize vertical select gates and floating gate memory cells to form NOR and NAND architecture memory cell strings, segments, and arrays. These memory cell architectures allow for an improved high density memory devices or arrays with integral select gates that can take advantage of the feature sizes semiconductor fabrication processes are generally capable of and allow for appropriate device sizing for operational considerations. The memory cell architectures also allow for mitigation of disturb and overerasure issues by placing the floating gate memory cells behind select gates that isolate the memory cells from their associated bit lines and/or source lines.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   a NOR architecture floating gate memory array formed on a substrate having a plurality of pillars and associated intervening trenches, and
   a plurality of memory cell structures, each memory cell structure comprising, a floating gate memory cell, wherein the floating gate memory cell is formed vertically on a first sidewall of a trench, and a select gate, wherein the select gate is formed on a second sidewall of the trench and wherein the select gate is coupled to the floating gate memory cell by a source and drain region formed at the bottom of the trench.

2. The memory device of claim 1, further comprising:

a plurality of word lines, wherein each word line is coupled to one or more control gates of the floating gate memory cells of the plurality of memory cell structures;

a plurality of select lines, wherein each select line is coupled to one or more control gates of the select gates of the plurality of memory cell structures;

at least one bitline, wherein the at least one bitline is coupled to one or more select gate drain regions formed at the top of the plurality of pillars of the plurality of memory cell structures; and at least one source line, wherein the at least one source line is coupled to one or more floating gate memory cell source regions formed at the top of the plurality of pillars of the plurality of memory cell structures.

3. The memory device of claim 2, wherein the plurality of memory cell structures are formed into rows and columns such that each trench contains a memory cell structure and where the floating gate memory cell and select gate of each memory cell structures of each row are arranged in an alternating pattern, such that each pillar of the row has either two select gates or two floating gate memory cells formed on opposing sidewalls.

4. A floating gate memory cell structure, comprising:

a substrate, comprising two raised areas, defining a trench therebetween;

a floating gate memory cell, wherein the floating gate memory cell is formed vertically on a first sidewall of the trench;

a select gate memory cell, wherein the select gate is formed vertically on a second sidewall of the trench; and wherein the floating gate memory cell is coupled to the select gate by source and drain region formed at the bottom of the trench.

5. The floating gate memory cell structure of claim 4, wherein the raised areas are pillars.

6. The floating gate memory cell structure of claim 4, further comprising:

a word line, wherein the word line is coupled to a control gate of the floating gate memory cell of the floating gate memory cell structure;

a select line, wherein the select line is coupled to a control gate of the select gate of the floating gate memory cell structure;

a bitline, wherein the bitline is coupled to a drain of the select gate; and a source line, wherein the source line is coupled to a source of the floating gate memory cell.

7. A floating gate memory array, comprising:

a substrate, comprising a plurality of pillars and associated intervening trenches, and a plurality of memory cell structures, each memory cell structure comprising, a floating gate memory cell, wherein the floating gate memory cell is formed vertically on a first sidewall of a trench, and a select gate, wherein the select gate is formed on a second sidewall of the trench and wherein the select gate is coupled to the floating gate memory cell by a source and drain region formed at the bottom of the trench.

8. The floating gate memory array of claim 7, further comprising:

a plurality of word lines, wherein each word line is coupled to one or more control gates of the floating gate memory cells of the plurality of memory cell structures;

a plurality of select lines, wherein each select line is coupled to one or more control gates of the select gates of the plurality of memory cell structures;

at least one bitline, wherein the at least one bitline is coupled to one or more select gate drain regions formed at the top of the plurality of pillars of the plurality of memory cell structures; and at least one source line, wherein the at least one source line is coupled to one or more floating gate memory cell source regions formed at the top of the plurality of pillars of the plurality of memory cell structures.

9. The floating gate memory array of claim 8, wherein the plurality of memory cell structures are formed into rows and columns such that each trench contains a memory cell structure and where the floating gate memory cell and select gate of each memory cell structure of each row are arranged in an alternating pattern, such that each pillar of the row has either two select gates or two floating gate memory cells formed on opposing sidewalls.

10. The floating gate memory array of claim 7, wherein the plurality of memory cell structures are formed into rows and columns and an isolation region is formed between adjacent rows of memory cell structures of the plurality of memory cell structures.

11. The floating gate memory array of claim 10, wherein the isolation region is an oxide insulator.

12. The floating gate memory array of claim 7, wherein the plurality of memory cell structures are formed into rows and columns and each row of memory cell structures is formed on a separate P-well isolation region formed on the substrate.

13. A memory device comprising:

a NOR architecture floating gate memory array formed on a substrate having a plurality of pillars and associated intervening trenches;

a plurality of memory cell structures, each memory cell structure comprising;

a floating gate memory cell, wherein the floating gate memory cell is formed vertically on a first sidewall of a trench; and a select gate, wherein the select gate is formed on a second sidewall of the trench and wherein the select gate is coupled to the floating gate memory cell by a source and drain region formed at the bottom of the trench;

a control circuit;

a row decoder;

a plurality of word lines, wherein each word line is coupled to one or more control gates of the floating gate memory cells of the plurality of memory cell structures;

a plurality of select lines, wherein each select line is coupled to one or more control gates of the select gates of the plurality of memory cell structures;

at least one bitline, wherein the at least one bitline is coupled to one or more select gate drain regions formed at the top of the plurality of pillars of the plurality of memory cell structures; and at least one source line, wherein the at least one source line is coupled to one or more floating gate memory cell source regions formed at the top of the plurality of pillars of the plurality of memory cell structures.

14. A system, comprising:
a processor coupled to at least one memory device, wherein the at least one memory device comprises,
a NOR architecture floating gate memory array formed on a substrate having a plurality of pillars and associated intervening trenches, and
a plurality of memory cell structures, each memory cell structure comprising,
a floating gate memory cell, wherein the floating gate memory cell is formed vertically on a first sidewall of a trench, and
a select gate, wherein the select gate is formed on a second sidewall of the trench and wherein the select gate is coupled to the floating gate memory cell by a source/drain region formed at the bottom of the trench.

15. A method of forming a floating gate memory cell structure, comprising:
forming two raised areas on a substrate, the raised areas defining an associated intervening trench;
forming a floating gate memory cell on a first sidewall of the trench;
forming a select gate on a second sidewall of the trench; and
forming a source and drain region at the bottom of the associated intervening trench.

16. The method of claim 15, wherein forming two raised areas on a substrate further comprises etching a trench in the substrate.

17. The method of claim 15, wherein forming two raised areas on a substrate further comprises forming two pillars on a substrate.

18. The method of claim 17, wherein forming two pillars on a substrate further comprises depositing additional substrate material on the substrate to form the two pillars.

19. The method of claim 15, wherein forming a source and drain region at the bottom of the associated intervening trench further comprises forming source and drain regions on the top of the two raised areas and at the bottom of the associated intervening trench in one of before the formation of the floating gate memory cell and select gate and after the formation of the floating gate memory cell and select gate.

20. The method of claim 15, wherein the substrate is P-doped.

21. The method of claim 15, wherein forming a floating gate memory cell on a first sidewall of the trench and forming a select gate on a second sidewall of the trench further comprises forming a floating gate transistor gate-insulator stack on a surface of the first sidewall and forming a select gate transistor gate-insulator stack on a surface of the second sidewall.

22. The method of claim 21, wherein forming a floating gate transistor gate-insulator stack on a surface of the first sidewall and forming a select gate transistor gate-insulator stack on a surface of the second sidewall further comprises forming a tunnel insulator on the surface of the first sidewall, forming a floating gate on the tunnel insulator, forming a first insulator as an intergate/interpoly insulator over the floating gate, and forming a first control gate over the first insulator, and on the surface of the second sidewall forming a second insulator and forming a second control gate over the second insulator.

23. The method of claim 22, wherein forming a tunnel insulator on the surface of the first sidewall, forming a floating gate on the tunnel insulator, forming a first insulator as an intergate/interpoly insulator over the floating gate, and forming a first control gate over the first insulator, and on the surface of the second sidewall forming a second insulator and forming a second control gate over the second insulator further comprises first forming a tunnel insulator on the surface of the first sidewall and forming a floating gate on the tunnel insulator, then forming the first and second insulators over the floating gate and on the surface of the second sidewall, and forming the first and second control gates over the first and second insulators, wherein each layer is deposited over the two raised areas and trench, masked, and directionally etched.

24. A method of forming a floating gate memory array, comprising:
forming a plurality of pillars and associated intervening trenches on a substrate by depositing a layer of masking material, patterning the masking material, and anisotropically etching the substrate; and
forming a plurality of floating gate memory cell structures, each floating gate memory cell structure having a floating gate and a coupled select gate, where each floating gate memory cell structure is formed by;
depositing a layer of tunnel insulator material over two pillars and an intervening trench;
masking and anisotropically etching the layer of tunnel insulator material to form a tunnel insulator of a floating gate memory cell on a first sidewall of the trench;
depositing a layer of floating gate material over the two pillars and intervening trench;
masking and anisotropically etching the layer of floating gate material to form a floating gate on the tunnel insulator on the first sidewall of the trench;
depositing a layer of gate insulator material over the two pillars and intervening trench;
masking and anisotropically etching the layer of gate insulator material to form a first gate insulator on the floating gate on the first sidewall and a second gate insulator of a select gate on a second sidewall of the trench;
depositing a layer of gate material over the two pillars and intervening trench;
masking and anisotropically etching the layer of gate material to form a first and second control gates on the first and second gate insulators on the first and second sidewalls of the trench; and
diffusing a dopant material into the bottom of the trench and the tops of the two pillars to form source regions and drain regions of the select gate and the floating gate memory cell.

25. The method of claim 24, further comprising:
forming the plurality of floating gate memory cell structures into rows; and
forming an isolation region between adjacent rows of floating gate memory cell structures by depositing an oxide insulator between adjacent rows.

26. A method of forming a NOR architecture floating gate memory array, comprising:
forming a plurality of pillars and associated intervening trenches on a substrate; and
forming a plurality of floating gate memory cell structures, each floating gate memory cell structure formed by;

forming a floating gate memory cell on a first sidewall of a trench;

forming a select gate on a second sidewall of the trench; and forming a source/drain region at the bottom of the trench.

27. The method of claim 26, wherein the substrate is P-doped.

28. The method of claim 26, further comprising:

forming the plurality of floating gate memory cell structures into rows; and forming a P-well isolation region under each row of floating gate memory cell structures.

29. The method of claim 26, further comprising:

forming the plurality of floating gate memory cell structures into rows; and forming an isolation region between adjacent rows of floating gate memory cell structures.

30. The method of claim 29, wherein forming an isolation region between adjacent rows of floating gate memory cell structures further comprises forming an isolation region of an oxide insulator.

31. The method of claim 29, further comprising:

forming a plurality of word lines across the isolation region between adjacent rows of floating gate memory cell structures, wherein each word line is coupled to a control gate of a single floating gate memory cell of each row of floating gate memory cell structures.

32. The method of claim 29, further comprising:

forming a plurality of select lines across the isolation region between adjacent rows of floating gate memory cell structures, wherein each select line is coupled to a control gate of a single select gate of each row of floating gate memory cell structures.

33. The method of claim 26, wherein forming a floating gate memory cell on a first sidewall of the trench and forming a select gate on a second sidewall of the trench further comprises forming a floating gate transistor gate-insulator stack on a surface of the first sidewall and forming a select gate transistor gate-insulator stack on a surface of the second sidewall.

34. The method of claim 33, wherein forming a floating gate transistor gate-insulator stack on a surface of the first sidewall and forming a select gate transistor gate-insulator stack on a surface of the second sidewall further comprises forming a tunnel insulator on the surface of the first sidewall, forming a floating gate on the tunnel insulator, forming a first insulator as an intergate/interpoly insulator over the floating gate, and forming a first control gate over the first insulator, and on the surface of the second sidewall forming a second insulator and forming a second control gate over the second insulator.

35. The method of claim 34, wherein forming a tunnel insulator on the surface of the first sidewall, forming a floating gate on the tunnel insulator, forming a first insulator as an intergate/interpoly insulator over the floating gate, and forming a first control gate over the first insulator, and on the surface of the second sidewall forming a second insulator and forming a second control gate over the second insulator further comprises first forming a tunnel insulator on the surface of the first sidewall and forming a floating gate on the tunnel insulator, then forming the first and second insulators over the floating gate and on the surface of the second sidewall, and forming the first and second control gates over the first and second insulators, wherein each layer is deposited over the trench, masked, and directionally etched in combined layers to produce the floating gate and select gate gate-insulator stacks.

36. The method of claim 26, further comprising:

forming at least one bitline, wherein the at least one bitline is coupled to one or more select gate drain regions formed at the top of the plurality of pillars of the plurality of memory cell structures; and forming at least one source line, wherein the at least one source line is coupled to one or more floating gate memory cell source regions formed at the top of the plurality of pillars of the plurality of memory cell structures.

37. The method of claim 26, wherein forming a plurality of floating gate memory cell structures further comprises forming a plurality of floating gate memory cell structures, wherein the plurality of memory cell structures are formed into rows and where the floating gate memory cell and select gate of each memory cell structure of each row are formed in an alternating pattern, such that each pillar of the row has either two select gates or two floating gate memory cells formed on its sidewalls.

38. A method of forming an EEPROM memory device, comprising:

forming a plurality of pillars and associated intervening trenches on a substrate;

forming a plurality of vertical floating gate memory cells on a first sidewall of each trench;

forming a plurality of vertical select gates on a second sidewall of each trench; and forming one or more source/drain regions at the bottom of the associated intervening trenches and one or more source or drain regions on the top of the plurality of pillars.

* * * * *

UNITED STATES PATENT AND TRADEMARK OFFICE
CERTIFICATE OF CORRECTION

PATENT NO.    : 6,878,991 B1
DATED         : April 12, 2005
INVENTOR(S)   : Forbes Page 1 of 1

It is certified that error appears in the above-identified patent and that said Letters Patent is hereby corrected as shown below:

<u>Title page,</u>
Item [57], ABSTRACT,
Line 9, "the features" should read -- the feature sizes --.

Signed and Sealed this

Third Day of January, 2006

JON W. DUDAS
*Director of the United States Patent and Trademark Office*